United States Patent
Plourde et al.

(10) Patent No.: US 7,016,382 B2
(45) Date of Patent: Mar. 21, 2006

(54) METHOD AND APPARATUS FOR STABILIZING LASER WAVELENGTH

(75) Inventors: James K. Plourde, Allentown, PA (US); John W. Stayt, Jr., Schnecksville, PA (US); Scott L. Broutin, Kutztown, PA (US); George J. Przybylek, Douglasville, PA (US)

(73) Assignee: TriQuint Technology Holding Co., Hillsboro, OR (US)

( * ) Notice: Subject to any disclaimer, the term of this patent is extended or adjusted under 35 U.S.C. 154(b) by 362 days.

(21) Appl. No.: 09/931,188

(22) Filed: Aug. 17, 2001

(65) Prior Publication Data

US 2003/0035617 A1 Feb. 20, 2003

(51) Int. Cl.
*H01S 3/13* (2006.01)

(52) U.S. Cl. ............................. 372/32; 372/20; 372/21; 372/102

(58) Field of Classification Search ................. 372/32, 372/21, 102; 359/15, 22; 356/519
See application file for complete search history.

(56) References Cited

U.S. PATENT DOCUMENTS

| | | | | |
|---|---|---|---|---|
| 5,691,989 A | * | 11/1997 | Rakuljic et al. | 372/20 |
| 6,134,253 A | * | 10/2000 | Munks et al. | 372/32 |
| 6,498,800 B1 | * | 12/2002 | Watterson et al. | 372/20 |
| 6,560,253 B1 | * | 5/2003 | Munks et al. | 372/32 |
| 2003/0035120 A1 | * | 2/2003 | Myatt et al. | 356/519 |

* cited by examiner

*Primary Examiner*—Mingun Oh Harvey
*Assistant Examiner*—Dung T. Nguyen
(74) *Attorney, Agent, or Firm*—Dickstein Shapiro

(57) ABSTRACT

Laser wavelength stabilization is achieved by locating a low selectivity reference filter in a reference path of a laser beam. The low selectivity reference filter, with a periodicity greater than the control filter, is used together with a lookup table for the reference filter to resolve the uncertainty associated with the multivalued control filter. After the wavelength uncertainty for the control filter is resolved, the laser beam is stabilized based on the response of the control filter, as if the reference filter was not present.

18 Claims, 3 Drawing Sheets

METHOD AND APPARATUS FOR STABILIZING LASER WAVELENGTH

FIELD OF THE INVENTION

This invention relates to laser wavelength stabilization and, more specifically, to a method and apparatus for stabilizing laser wavelength utilizing a relatively low selectivity optical filter located in a reference path of a multi-path wavelength control system.

DISCUSSION OF THE RELATED ART

An optical wavelength division multiplex (WDM) system may be used to transmit an increased quantity of information as compared to a single optical channel system. A WDM system, however, requires a stabilized light source. Stabilization may be needed to transmit laser lights of multiple wavelengths within a relatively narrow wavelength band, for example, at intervals of 1 nm or less. Moreover, in optical information processing or optical measurement, the wavelength stabilization of the laser light source is an important parameter for enhancing the density of information and improving the precision of measurement.

The emission wavelength of a laser light source can be stabilized by employing an optical filter having a predetermined wavelength transmission characteristic, and by detecting an error from the desired emission wavelength. A control signal, based on the emission wavelength error, is fed back to the laser light source for compensation. It is known, for example, to stabilize the emission wavelength of a laser light source by using a multi-layer interference optical filter or a Fabry-Perot (FP) etalon.

An FP etalon may be constructed for example as a multi-layer single cavity filter type, where an all-dielectric mirror/spacer/mirror structure is deposited on a glass substrate. Alternatively, a solid etalon type may be used, in which mirrors are deposited on both sides of a glass spacer plate. Whichever implementation is used, the intensity of the beam that is allowed through the etalon is a function of the wavelength of the beam incident upon it. This principal is illustrated in FIG. 1 to aid in the understanding of the present invention.

Etalon 100 is a quartz disk having flat opposed parallel surfaces 103, 105 separated by a distance "d". In FIG. 1, as light beam 107 passes through the front surface 105 of the etalon 100, a reflected portion 107' is reflected back toward the back surface 103. The reflected beam 107' is itself reflected at the back surface 103 to form another reflection beam 107" which passes through the front surface 105.

Multiple reflections continue and if the distance d is equal to a half wavelength, or a multiple thereof, of the beam 107, then all reflections passing through the front surface 105 will be in phase with the original beam 107. This reinforces the transmitted beam such that maximum intensity for that particular wavelength is transmitted, with the intensity decreasing for longer and shorter wavelengths. (FIG. 1 illustrates a situation where a laser light beam is coincident (or parallel) with the optical axis of the etalon 100. Although the reflection beams 107', 107" are shown displaced from one another in FIG. 1, they actually may be all on the same optical axis.)

An FP etalon, like other optical filters, is periodic (multi-valued). It must either possess a certain selectivity to meet the stability specifications or possess a certain thickness to allow practical handling during manufacture. In addition, it is desirable but not necessary to have the periodicity of the FP etalon agree with the International Telecommunications Union (ITU) which is now set at Δf=100 GHz but may be set at 50 GHz or less in the future. The periodicity or multi-valued nature of the FP etalon can be a problem since it is difficult to determine which cycle corresponds to the desired operating point.

Hence, what is needed is a method to avoid the uncertainty associated with the periodic nature of high selectivity FP etalons or other periodic filters. There is a need in the art for an improved wavelength stabilization system that employs one or more such high selectivity filters.

SUMMARY OF THE INVENTION

A method and apparatus for laser wavelength stabilization is disclosed where a low selectivity reference filter is located in a reference path of a laser beam, and a multi-valued control filter is located in a control path. The reference filter, with a periodicity greater than the control filter, is used together with a lookup table to resolve the uncertainty associated with the control filter, and then the control filter is used to lock the laser source on the desired wavelength. When a change request to another wavelength is received, the reference filter lookup table is consulted to determine what parameters are associated with that wavelength and the operation is then set within the desired cycle or period of the control filter.

The above advantages and features of the invention will be more clearly understood from the following detailed description which is provided in connection with the accompanying drawings.

DETAILED DESCRIPTION OF PREFERRED EMBODIMENTS

Figure 1:
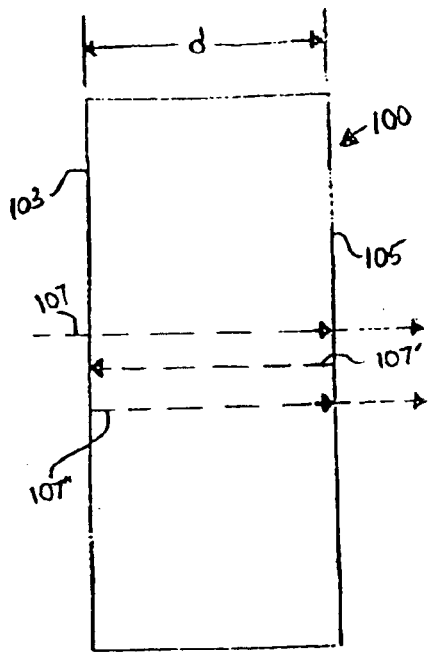
FIG. 1 schematically illustrates the operation of an FP etalon (an example of a multi-valued optical filter)

Preferred embodiments of the present invention are illustrated in FIGS. 2–5. Other embodiments may be utilized and structural changes may be made without departing from the spirit or scope of the present invention. Although the invention is described with reference to a single reference filter, the invention is also applicable to laser systems that have more than one reference filter. Also, although the reference filter may be an integral part of the laser system, the invention is also applicable to lasers having a separate reference filter. Like items are referred to by like reference numerals throughout the drawings.

Figure 2:
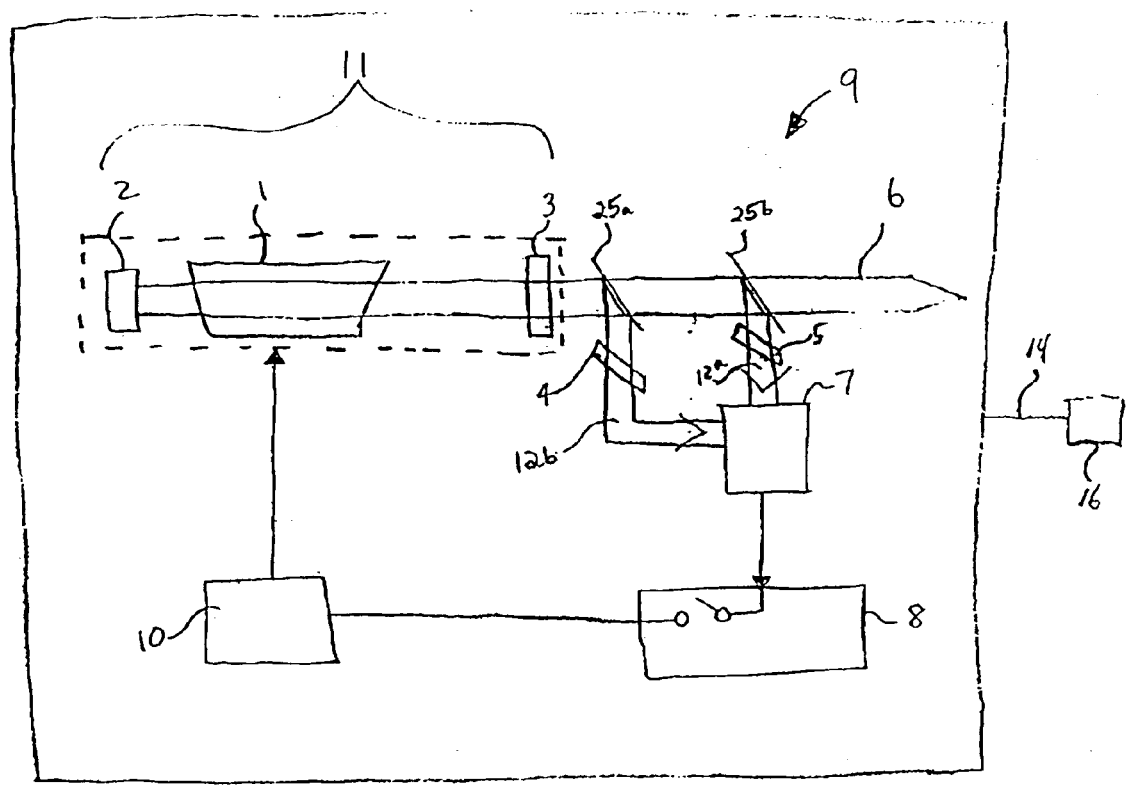
FIG. 2 is an illustration of a wavelength stabilized laser system constructed according to the present invention.

FIG. 2 is a schematic illustration of a laser system 9. The system 9 has a laser medium 1 and a light resonator 11. The light resonator 11 includes a high reflection mirror 2 and an incomplete reflection mirror 3. The light generated by the medium 1 is amplified while being reflected within the resonator 11 numerous times before exiting as laser beam 6. The illustrated laser system 9 also has a reference filter 5, a control filter 4, beam splitters 25a, 25b, a wavelength monitor system 7, a control system 8, and a servo system 10 for controlling the laser medium 1. If the laser medium 1 is a DBR laser, it can be operated by the application of tuning currents. The laser system 9 may be connected by optical fiber 14 (or some other waveguide) to receiver 16. The receiver 16 may include a photodiode, for example.

Reference filter 5 is preferably an FP etalon. Reference filter 5 has a lower selectivity than the control filter 4. Selectivity is defined herein as $\Delta$ transmission/$\Delta$ wavelength. Also, reference filter 5 is fabricated to have a periodicity greater than that of the control filter 4. Periodicity is defined herein as the wavelength range between consecutive maximum intensity peaks and is related to the free spectral range (FSR).

For a given wavelength range, a multiple number of maximum peaks associated with the transmission through the control filter 4 is observed for every maximum peak associated with the transmission through reference filter 5. The transmission through reference filter 5 may be utilized to determine the desired operating point cycle of the control filter 4, as will be discussed further below.

Referring still to FIG. 2, the wavelength of light on reference path 12a (i.e., the wavelength of the beam that is reflected by the second beam splitter 25b) is approximately measured (as a function of its intensity) by wavelength monitor system 7. This measured value is then input into control system 8. Control system 8 may contain data (the so called "look-up table") corresponding to the various optical characteristics of the reference filter 5. The control system 8 causes a certain bias voltage and temperature (determined from the lookup table) to be applied to the laser medium 1 by servo system 10 to bring the wavelength of the light transmitted along reference path 12a to near a desired target. The control filter 4, which is highly selective, is then used to bring the wavelength of the light on control path 12b (i.e., the portion of the beam 6 reflected by the first beam splitter 25a) to the desired value within predetermined specifications. A feed-back loop based on the wavelength characteristics of the light transmitted along control path 12b assures that the laser beam 6 locks onto the desired wavelength.

Figure 3:
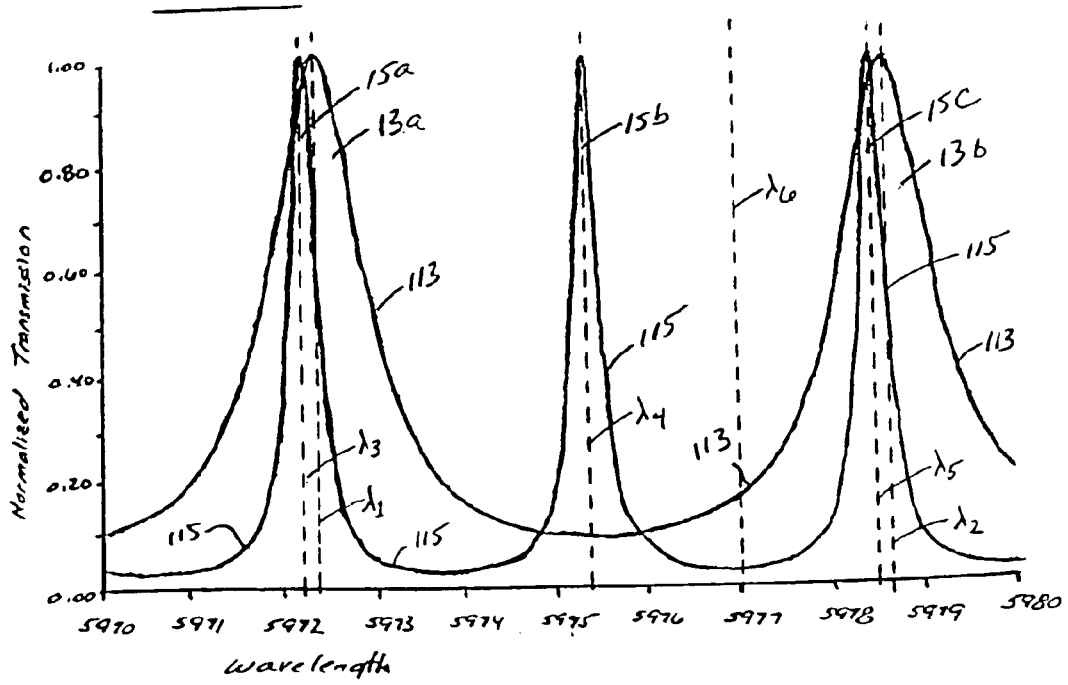
FIG. 3 illustrates a method of utilizing a reference period which is twice that of the control period.

FIG. 3 shows the reference and control responses 113, 115 of the reference and control filters 5, 4, respectively. That is, the normalized intensity of the light transmitted along the reference and control paths 12a, 12b is shown as a function of the wavelength of the laser beam 6. The reference response 113 has a reference period characterized by maximum peaks 13a, 13b. That is, the intensity of the light on reference path 12a is at a maximum value (normalized value=1.0) when the wavelength of the laser beam 6 is $\lambda_1$ or $\lambda_2$.

The control response 115 has a control period characterized by maximum peaks 15a, 15b, 15c. The intensity of the light on control path 12b is at a maximum value (normalized value=1.0) when the wavelength of the laser beam 6 is $\lambda_3$, $\lambda_4$ or $\lambda_5$. The period of the reference response 113 (i.e., the difference in wavelength between adjacent peaks 13a, 13b) is greater than the period of the control response 115. In FIG. 3, the period of the control response 115 is the wavelength difference between adjacent control response peaks 15b, 15c, such that: $\lambda_2 - \lambda_1 > \lambda_5 - \lambda_4$.

Assume, for example, still referring to FIG. 3, that the wavelength of the laser beam 6 immediately following a wavelength change request is $\lambda_6$ (i.e., at a wavelength between adjacent control response peaks 15b, 15c). Assume also that the desired operating wavelength for the beam 6 is $\lambda_5$ (at the third control response peak 15c in FIG. 3). In this example, the operating parameters of the laser 1 (bias, temperature, etc.) would be modified first as a function of the output of the reference filter 5 (i.e., based on the reference response 113), to move the laser beam wavelength from $\lambda_6$ to $\lambda_2$ (i.e., to the reference response peak 13b known to be in the vicinity of the desired wavelength $\lambda_5$). Then, feedback control of the laser source 1 based on the output of the control filter 4 (i.e., following the control response 115) would be used to move the beam wavelength from $\lambda_2$ to $\lambda_5$ (i.e., to the desired wavelength at the third control response peak 15c).

Note that, in the foregoing example, if the step of making an initial, approximate laser wavelength adjustment based on the reference response 113 were not available, then it would be difficult for the system to distinguish between the desired wavelength $\lambda_5$ and the wavelength $\lambda_4$ at the adjacent control response peak 15b. In other words, if the reference filter 5 were not employed, it would be difficult for the system to decide whether to move from $\lambda_6$ to $\lambda_5$ or from $\lambda_6$ to $\lambda_4$.

In FIG. 3, the reference period ($\lambda_2 - \lambda_1$) is twice as long as the control period ($\lambda_5 - \lambda_4$). This two-to-one period relationship has the advantage of maximizing the amplitude difference of the reference response 113 with respect to cycles of the control response 115 that are adjacent (but not within) the desired operating point cycle. The advantage can be illustrated as follows: In the example shown in FIG. 3, the normalized amplitude of the reference response 113 is almost 1.0 in the vicinity of the third control response peak 15c, and is about 0.1 in the vicinity of the adjacent, second control response peak 15b. The normalized difference in the amplitude of the reference response 113 between the second and third control response peaks 15b, 15c is almost 0.9 (1.0−0.1=0.9).

In the illustrated example, the second control response peak 15b is the one that needs to be distinguished from the third control response peak 15c. Consequently, it is advantageous to have a large amplitude difference in the reference response 113 between the second and third control peaks 15b, 15c, so that the reference response 113 can be used effectively to move the wavelength of the laser beam 6 toward the approximate desired wavelength ($\lambda_2$) If the period of the reference response 113 were greater than twice that of the control response 115, then, with all other parameters being equal, the normalized amplitude of the reference response 113 would be equal to 0.1 at some point to the left of the second control response peak 15b (in FIG. 3). As a result, the normalized amplitude of the reference response 113 would be greater than 0.1 at the second control response peak 15b, and the difference in normalized amplitude between the second and third response peaks 15b, 15c would be less than 0.9.

The desired operating point cycle is the wavelength range within which locking control for the laser beam 6 can be accomplished based on the control response 115. In the system described above, the wavelength 115 of the laser beam 6 is first moved into the desired operating point cycle by moving it based on the amplitude of the light transmitted through the reference path 12a. In an alternative embodiment of the invention, the wavelength can be moved into the desired operating point cycle by moving it to a point where the reference and control responses 113, 115 have a predetermined relationship. For example, the wavelength of the beam 6 could be moved into the desired operating point cycle by moving it from $\lambda_6$ to the nearest point where the reference and control responses 113, 115 are both high. Once the beam wavelength is moved into the desired operating point cycle, the control response 115 can be used to lock the wavelength of the beam 6 onto the desired wavelength $\lambda_5$.

Once the beam 6 is locked onto the desired wavelength, the characteristics of the laser medium 1 (bias, temperature, etc.) are then adjusted or maintained over time based on the control response 115 within the desired operating point cycle, until another change request is received. That is, in a preferred embodiment of the invention, the reference response 113 is only used to guide the laser beam wavelength to the desired operating point cycle of the control filter, and only the more selective control filter 4 is used then to lock and maintain the beam 6 on the desired wavelength.

Figure 4:
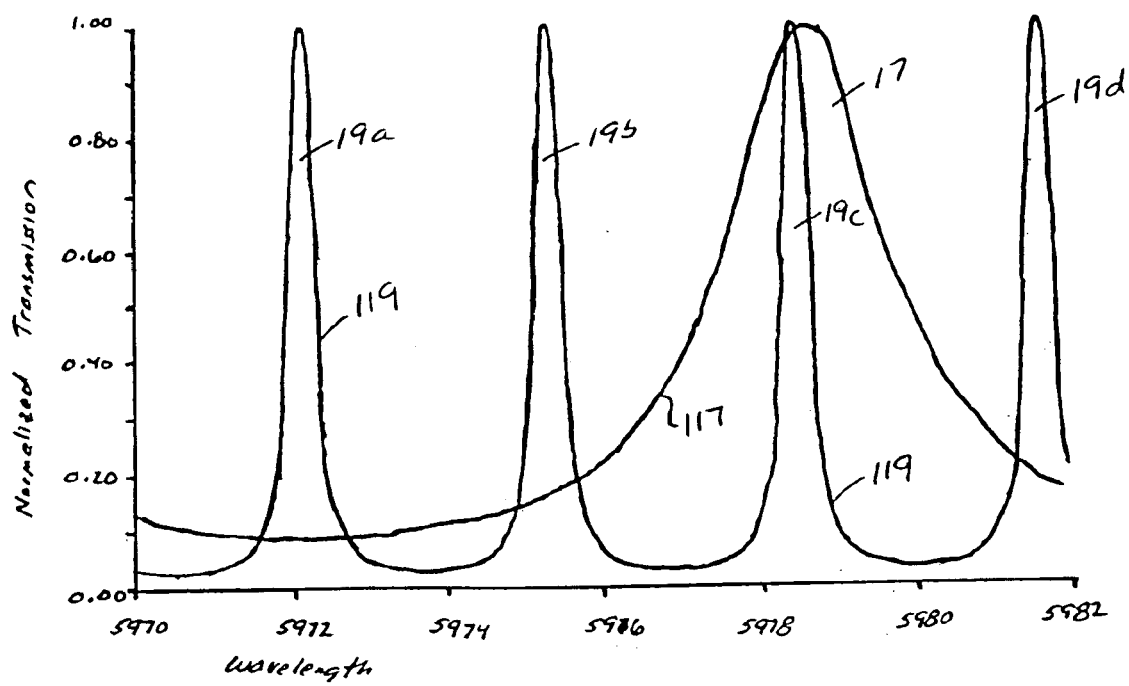
FIG. 4 illustrates a method of utilizing a reference period which is quadruple that of the control period.

In the method shown in FIG. 4, the invention operates with a reference period (the wavelength difference between adjacent peaks 17) which is quadruple that of the control period (the wavelength difference between adjacent control response peaks 19a, 19b, 19c and 19d). The control system 8 compares the responses 119, 117 of control filter 4 and reference filter 5, respectively, to determine the proper operating point cycle of the control filter 4. The characteristics of laser medium 1 are then adjusted by the servo system 10 for operating conditions as required (i.e. adjusted for bias, temperature, etc.) based on the wavelength characteristics of the light transmitted along the control path 12b.

Figure 5:
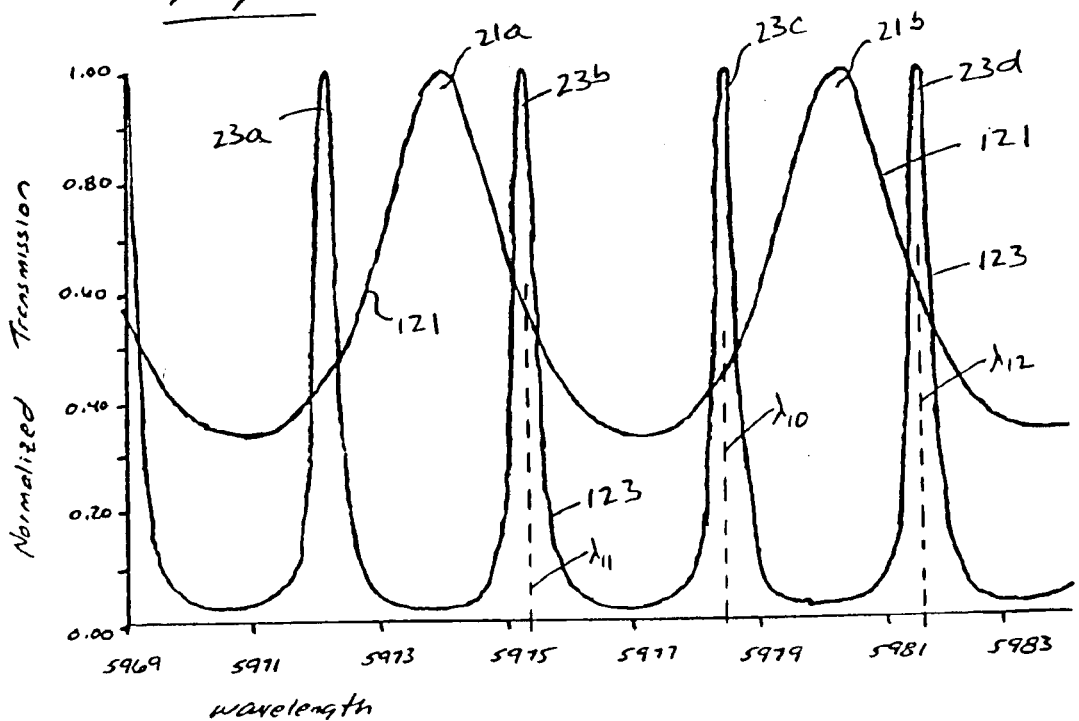
FIG. 5 illustrates another method of utilizing a reference period which is twice that of the control period.

FIG. 5 shows another way in which the present invention can operate with a reference period which is twice that of the control period. The maximum peaks of the reference response 121 are designated by reference numerals 21a, 21b. The maximum peaks (wavelengths of greatest transmission intensity) of the control response 123 are designated by reference numerals 23a, 23b, 23c and 23d. In this embodiment, the signs of the slopes of the reference response 121 can be used to discriminate between desired and undesired wavelengths. For example, the positive slope of the reference response 121 at a first wavelength $\lambda_{10}$ can be used to distinguish the first wavelength $\lambda_{10}$ from second and third wavelengths $\lambda_{11}$, $\lambda_{12}$ which have negative slopes.

In this manner, if the desired operating wavelength is at the third peak 23c of the control response 123, then the system can determine that the first wavelength $\lambda_{10}$ is in the vicinity of the desired wavelength and the second and third wavelengths $\lambda_{11}$, $\lambda_{12}$ are not near the desired wavelength. That is, the system can determine that the first wavelength $\lambda_{10}$ is in the desired operating point cycle of the control filter whereas the second and third wavelengths $\lambda_{11}$, $\lambda_{12}$ are not in the desired operating point cycle, even though the amplitudes of the first, second and third wavelengths $\lambda_{10}$–$\lambda_{12}$ are all about the same.

If the desired operating point cycle happens to fall near a maxima or minima of the reference filter 5 (near where its sign changes), then two reference filters with slightly different characteristics may be employed with the appropriate one chosen. The measured values are input into control system 8 which compares the slopes of the reference response 121 to determine the proper operating point cycle of the control filter 4. The characteristics of the laser medium 1 are then adjusted by the servo system 10 for operating conditions as required (i.e. adjusted for bias, temperature, etc.) based on the wavelength transmission characteristics of the control filter 4, as if the reference filter 5 were not present.

Hence, highly selective laser wavelength stabilization may be achieved by a system that has a low selectivity reference filter 5 located in a reference path 12a. The low selectivity reference filter 5, with a periodicity greater than the control filter 4, is used together with a lookup table for the reference filter 5 to resolve the uncertainty associated with the multi-valued control filter 4. After the desired region of the control filter response is identified, the lookup table is used to calculate a control signal to be applied to the servo system 10 based on the control filter response. Thus, when a change request to another wavelength is received, the reference filter lookup table is consulted to determine what parameters are associated with that wavelength and the operation is then set within a cycle of the control filter 4.

Although the invention has been described above in connection with exemplary embodiments, it is apparent that many modifications and substitutions can be made without departing from the spirit or scope of the invention. Accordingly, the invention is not to be considered as limited by the foregoing description, but is only limited by the scope of the appended claims.

What is claimed as new and desired to be protected by Letters Patent of the United States is:

1. A laser system comprising:
   a control path and a reference path;
   a control filter for stabilizing a laser beam, said control filter having a first periodicity, said control filter being located in said control path; and
   a reference filter for determining an operating point cycle of said control filter, said reference filter having a second periodicity greater than said first periodicity and having a selectivity lower than a selectivity of said control filter, said reference filter being located in said reference path.

2. The laser system of claim 1, further comprising a device for determining the wavelength characteristics of light transmitted along said reference path and said control path.

3. The laser system of claim 2, further comprising a controller for comparing said wavelength characteristics.

4. The laser system of claim 3, further comprising a laser medium for generating said laser beam, and a servo system connected to said controller for controlling said laser medium.

5. The system of claim 1, wherein said filters include an etalon.

6. A wavelength division multiplex communication system, comprising:
   a control path and a reference path;
   a control filter for stabilizing a laser beam, said control filter having a first periodicity, said control filter being located in said control path; and
   a reference filter for determining an operating point cycle of said control filter, said reference filter having a second periodicity greater than said first periodicity and having a selectivity lower than a selectivity of said control filter, said reference filter being located in said reference path; and
   an optical waveguide for transmitting said laser beam.

7. The system of claim 6, wherein said waveguide includes an optical fiber.

8. The system of claim 7, further comprising a device for generating said laser beam, and wherein said control filter is located between said device and said reference filter.

9. A laser system comprising:
   a resonator for generating a laser beam;
   a control filter for stabilizing said laser beam, said control filter being located in a control path and said control filter having a first periodicity; and
   a reference filter for determining an operating point cycle of said control filter, said reference filter having a second periodicity greater than said first periodicity and having a selectivity lower than a selectivity of said control filter.

10. The system of claim 9, further comprising a wavelength monitor for generating an output, said monitor being located in said reference path.

11. The system of claim 10, further comprising a laser medium located in said resonator, and a controller for responding to said output of said monitor to control said laser medium.

12. The system of claim 10, further comprising a laser medium located in said resonator, and a servo system operatively connected to a controller for controlling said laser medium.

13. The system of claim 9, wherein said reference filter includes an etalon.

14. The system of claim 9, further comprising a beam splitter for transmitting a portion of said laser beam along said control path.

15. The device of claim 14, further comprising a beam splitter for transmitting a portion of said laser beam along a reference path.

16. The device of claim 14, wherein said beam splitter is located between said resonator and said reference filter.

17. A method of stabilizing the wavelength of a laser beam comprising the acts of:

transmitting light through a control filter and a reference filter, wherein said control filter has a first periodicity and said reference filter has a second periodicity greater than said first periodicity, and wherein said reference filter has a lower selectivity than said control filter;

measuring the wavelength characteristics of light on a reference path associated with said reference filter;

determining an operating point cycle of said control filter based on said measured wavelength characteristics; and controlling a laser medium within said operating point cycle.

18. The method of claim 17, further comprising the act of transmitting said beam in a wavelength division multiplex communication system.

* * * * *